(12) United States Patent
Ufert

(10) Patent No.: US 7,511,294 B2
(45) Date of Patent: Mar. 31, 2009

(54) RESISTIVE MEMORY ELEMENT WITH SHORTENED ERASE TIME

(75) Inventor: Klaus-Dieter Ufert, Unterschleissheim (DE)

(73) Assignee: Infineon Technologies AG, Neubiberg (DE)

( * ) Notice: Subject to any disclaimer, the term of this patent is extended or adjusted under 35 U.S.C. 154(b) by 393 days.

(21) Appl. No.: 11/346,571

(22) Filed: Feb. 3, 2006

(65) Prior Publication Data

US 2006/0181920 A1 Aug. 17, 2006

(30) Foreign Application Priority Data

Feb. 9, 2005 (DE) .................... 10 2005 005 938

(51) Int. Cl.
*H01L 29/12* (2006.01)
(52) U.S. Cl. ............ 257/5; 257/E45.002; 257/E29.002; 438/102; 438/104
(58) Field of Classification Search ........................ 257/5
See application file for complete search history.

(56) References Cited

U.S. PATENT DOCUMENTS

| 6,579,463 | B1 | 6/2003 | Winningham et al. |
| 6,656,568 | B1 | 12/2003 | Winningham et al. |
| 6,844,564 | B2 * | 1/2005 | Tanaka et al. ................ 257/3 |
| 6,927,411 | B2 * | 8/2005 | Kozicki ........................ 257/4 |
| 2002/0123227 | A1 | 9/2002 | Winningham et al. |
| 2003/0047028 | A1 * | 3/2003 | Kunitake et al. ............. 75/230 |
| 2003/0137869 | A1 | 7/2003 | Kozicki |
| 2005/0285096 | A1 | 12/2005 | Kozicki |

OTHER PUBLICATIONS

Mulligan, R.F. et al., "Synthesis and Characterization of ZnO Nanostructures Templated Using Diblock Copolymers", *Journal of Applied Polymer Science*, 2003, vol. 89, S. 1058-1061.

* cited by examiner

Primary Examiner—Jerome Jackson, Jr.
(74) *Attorney, Agent, or Firm*—Edell, Shapiro & Finnan, LLC

(57) ABSTRACT

A resistive memory element for reversibly switching between a high-resistance OFF state and a low-resistance ON state includes a reactive electrode, an inert electrode and a solid electrolyte arranged between the two electrodes. The resistive memory element further includes a nanomask structure arranged in the solid electrolyte, in particular at the inert electrode, where the nanomask structure is provided with openings through which the solid electrolyte makes contact with the inert electrode.

19 Claims, 4 Drawing Sheets

2.9 nm 7.9 nm

RESISTIVE MEMORY ELEMENT WITH SHORTENED ERASE TIME

CROSS REFERENCE TO RELATED APPLICATIONS

This application claims priority under 35 USC § 119 to German Application No. DE 10 2005 005 938.4, filed on Feb. 9, 2005, and titled "Resistive Memory Element With Shortened Erase Time," the entire contents of which are hereby incorporated by reference.

FIELD OF THE INVENTION

The present invention relates to a resistive memory element, in particular a solid electrolyte memory element, which can be switched between a high-resistance OFF state and a low-resistance ON state.

BACKGROUND

In modern electronic systems, DRAM memories or flash memories are often used as nonvolatile memories. Although flash memory technology has undergone scaling into the range below 100 nm in recent years, the disadvantages of these memory technologies, such as long write/erase times, which typically lie in the milliseconds range, high write voltages, which typically lie in the range of 10 to 13 V, and accordingly require high programming energies, and also the limited number of read and write cycles, have heretofore not been solved satisfactorily. Furthermore, it must be assumed that, on account of their memory mechanism based on the storage of charge, even these memory technologies will encounter their scaling limits in the foreseeable future. Furthermore, the fabrication method in particular for flash memory cells is costly and comparatively complex.

By contrast, memory components based on resistive memory cells, in particular so-called CBRAM (conductive bridging RAM) memory cells or solid electrolyte memory cells, represent a new and promising technology for semiconductor-based memory components. With this type of memory components, a resistive memory cell can be switched by electrical pulses between a high-resistance state ("OFF" state) and a low-resistance state ("ON" state), as a result of which one information unit (bit) can be stored.

In concrete terms, the memory element of a resistive CBRAM memory cell is typically constructed from an inert electrode, a reactive electrode, and also a highly resistive—but conductive for ions—carrier material (solid electrolyte) arranged between these two electrodes. The two electrodes form together with the solid electrolyte a redox system in which a redox reaction proceeds above a defined threshold voltage. Depending on the polarity of a voltage applied to the two electrodes, which must be greater than the threshold voltage, the redox reaction can proceed in one reaction direction or the other, metal ions being produced or discharged. Metal ions produced at the reactive electrode are reduced in the solid electrolyte and form metallic precipitates which increase in their number and size until a low-resistance metallic current path bridging the two electrodes finally forms. In this state, the electrical resistance of the solid electrolyte is reduced significantly, for instance by several orders of magnitude, compared with the high-resistance OFF state without such a low-resistance current path, whereby the ON state of the CBRAM memory cell is defined.

In particular, chalcogenides, which are alloys containing chalcogens (elements of main group VI of the periodic table), have been investigated with regard to their suitability as a carrier material, and it has been shown that these alloys have particularly good switching properties.

More precise investigations of the metallic current path bridging the two electrodes have shown that usually a plurality of autonomous metallic bridges are formed between the two electrodes. This has the effect, however, that these bridges in each case have to be resolved again during the erase operation (by application of a voltage of opposite polarity to that when writing to or programming the memory cell), that is to say that the metallic precipitants of the metallic bridges have to be oxidized to form metal ions and electrons. For this reason, a comparatively long period of time is disadvantageously required until the resistive memory element of the memory cell can assume its high-resistance (OFF) state again without metallic bridges between the electrodes, that is to say the resistive memory cell can be erased. While the programming operation is effected in the nanoseconds range, substantially longer time periods are required for the erase process for this reason. No precautions or methods that can bring about a solution to this problem have as yet been disclosed heretofore.

SUMMARY OF THE INVENTION

The present invention provides a resistive memory element of a resistive memory cell that reversibly switches between a high-resistance OFF state and a low-resistance ON state and which avoids the disadvantage of comparatively long erase times.

In accordance with the present invention, a resistive memory element for reversibly switching between a high-resistance OFF state and a low-resistance ON state comprises a reactive electrode, an inert electrode and a solid electrolyte arranged between the two electrodes. The resistive memory element further comprises a nanomask structure arranged in the solid electrolyte, where the nanomask structure is provided with openings through which the solid electrolyte makes contact with the inert electrode.

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

Figure 1:
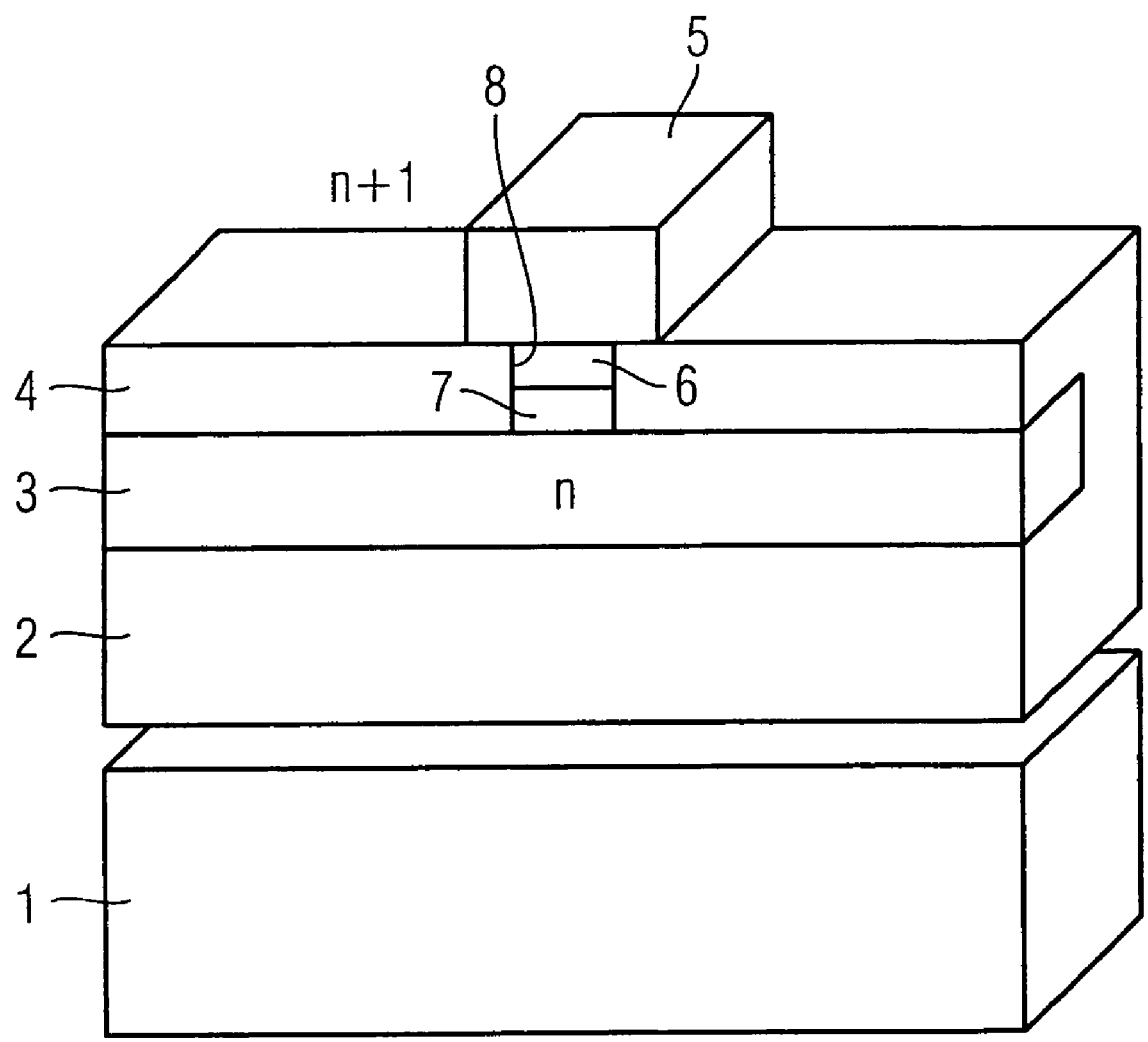
FIG. 1 schematically depicts a perspective view of a CBRAM memory cell with an "active in via" structure.

In accordance with the present invention, a resistive memory element (or switching element) for reversibly switching between a high-resistance OFF state and a low-resistance ON state includes a reactive electrode (e.g., a metallic electrode or metal electrode), an inert electrode and a solid electrolyte arranged between the two electrodes. The solid electrolyte electrically insulates the two electrodes from one another if no metallic current path is formed between the two electrodes, whereby the high-resistance OFF state is defined. On the other hand, the reactive electrode, which together with the solid electrolyte forms a redox system, is capable of emitting metal ions into the solid electrolyte upon application of a positive potential, which metal ions are reduced in the solid electrolyte and precipitate ("electrodeposition"). A metallic current path bridging the two electrodes can thereby arise, namely when a limit concentration of the metallic precipitants in the solid electrolyte is reached or exceeded, whereby the low-resistance ON state of the memory cell is defined. The solid electrolyte may be doped with a metal, for which purpose the metal of the reactive electrode is preferably used, in which case it must be ensured that the solid electrolyte enables an electrical resistance having a sufficiently high value between the two electrodes in the OFF state of the memory cell.

The resistive memory element according to the invention further includes a nanomask structure arranged in the solid electrolyte, said nanomask structure being provided with openings through which the solid electrolyte makes contact with the inert electrode. In a preferred refinement of the nanomask structure, the latter is deposited as an essentially planar nanoparticle structure on the inert electrode, the nanoparticles being arranged at a defined distance from one another, whereby (passage) openings or gaps having a defined average size are formed in the nanomask structure. Through the openings in the nanoparticle structure the solid electrolyte passes into direct (electrical) contact with the inert electrode. Nanoparticle structures of this type are described, for example, in R. T. Clay, R. E. Cohen; *Supramol. Scienc.* Vol 5 (1998) page 41 and R. F. Mulligan, A. Iliadis, P. Kofinas; *Journal Appl. Polymer Science,* Vol. 89 (2003), page 1058, the disclosures of which are incorporated by reference in their entireties.

Accordingly, such a nanoparticle structure generally includes nanoparticles which are in (Coulomb) interaction with one another and assume a defined distance from one another and in this way form the openings in the nanoparticle structure. If suitable starting molecules or elements, such as diblock copolymers, are chosen, a nanoparticle structure forms in this case in a self-assembled manner after a solution containing this is applied to a substrate such as the inert electrode, during a subsequent drying operation. According to the invention, such a nanomask (particle) structure formed in self-assembled form is preferably arranged on the inert electrode.

The memory element according to the invention with a nanomask structure advantageously makes it possible to prevent the formation of comparatively large metallic bridge clusters of the metallic current path bridging the two electrodes particularly in the vicinity of or at the inert electrode. In particular, it is thereby possible to reduce the number of metallically conductive bridges formed between the two electrodes and the dimension (or lateral extent) thereof in a direction perpendicular to the field-induced drift direction of the metal ions between the electrodes during the programming of the memory cell. If the nanomask structure is applied on the inert electrode, which is preferred according to the invention, the number of possible metallic bridges between the electrodes is limited by the reduction of the effective contact area between the solid electrolyte and the inert electrode by virtue of the nanomask structure.

The average size of the openings of the nanomask structure may advantageously be set in such a way that the formation of relatively large metal bridge clusters and also the number of metallic bridges between the electrodes can be inhibited in a desired manner since the metal ions for forming the metal clusters for forming the metallic bridges between the electrodes have to drift through the openings in the nanomask structure. Only such metal conglomerate dimensions before and on the inert electrode which can form in the small dimensions of the openings of the nanomask structure are thus made possible. The metal ions can only reach the inert electrode through the field-induced drift through the nanomask structure and establish a continuous metallic bridge through reduction by electrons. As a consequence of this, erasing the memory cell requires less time than as in the conventional case without a nanomask structure according to the invention.

A preferred average size of the openings in the nanoparticle structure lies in the range of about 3 nm to about 15 nm. In addition, the average size of the nanoparticles preferably correspond to about the average size of the openings in the nanomask structure.

The nanomask structure is preferably composed of an electrically insulating material, e.g., an oxide. For a sufficient insulation effect of the nanomask structure it is advantageous if the layer thickness of the essentially planar nanomask structure lies in the range of about 2.5 nm to about 5 nm.

As described above, the electrodes and the solid electrolyte together form a redox system in which, above a defined threshold voltage ($V_{th}$), a redox reaction proceeds which leads to the formation of a low-resistance metallic current path that electrically connects the two electrodes. The solid electrolyte is conductive for the metal ions of the reactive electrode, but it should be clear that, according to the invention and in accordance with the general understanding in the technical field, an "electrically conductive state" enables an electron current which is regarded as different from the "ionically conductive state" of the solid electrolyte without a low-resistance current path. For this reason, the solid electrolyte, even though it is ionically conductive, can electrically insulate the two electrodes from one another, that is to say constitute a resistance of sufficiently high value between the two electrodes, to define the OFF state of the switching element.

If an anodic potential (positive pole of an electrical voltage), which is higher than the redox potential of the redox system reactive electrode/solid electrolyte, is applied to the reactive electrode, then the reactive electrode is oxidized and metal ions are generated which are emitted into the solid electrolyte. The redox potential defines the threshold voltage for starting the redox reaction. A "reactive electrode" in the sense of the invention is thus able to generate (or to annihilate) metal ions if a voltage of suitable polarity which is higher than the threshold voltage is applied to the two electrodes. In contrast, an "inert electrode" is defined as an electrode which is unable to generate metal ions if the threshold voltage designated above is applied to the two electrodes, that is to say that the material of the inert electrode is chosen such that its redox potential in conjunction with the solid electrolyte is in any case higher than that of the material of the reactive electrode. The material of the inert electrode is furthermore chosen such that it does not react chemically with the solid electrolyte.

The solid electrolyte of the memory element according to the invention is an ionically conductive material that has a good ionic conductivity for the metal ions of the reactive electrode or can be brought to such a state by heating. Such a solid electrolyte is advantageously a semiconducting material in a specific temperature interval. The solid electrolyte preferably comprises an alloy containing at least one chalcogen, that is to say an element of main group VI of the periodic table, such as O, S, Se, or Te. A chalcogenide alloy may be, for example, Ag—S, Ag—Se, Ni—S, Cr—S, Co—S, Ge—S, GeSe, Cu—S or Cu—Se. According to the invention, the solid electrolyte of the switching element may also be a porous metal oxide, such as $AlO_x$, $WO_x$, $Al_2O_3$, or $TiO_x$.

The above examples for the solid electrolyte are not intended to restrict the invention thereto. Rather, it is possible in general to use any solid electrolyte as long as it exhibits the desired electrical behavior such as has been specifically represented further above.

The material of the reactive electrode may be a metal chosen for example from Cu, Ag, Al, Au, Ni, Cr, V, Ti or Zn. The inert electrode may comprise a material chosen for example from W, Mo, Ti, Ta, TiN, doped Si and Pt.

The solid electrolyte may, in particular, be doped with a metal, which is preferably the same metal as that of the reactive electrode. However, it may also be doped with other metallic elements in order to optimize the electrical properties. When such a doping is present, it is advantageously possible to reduce the period of time for establishing a low-resistance current path for bridging the two electrodes, since only the remaining "gaps" between adjacent metal precipitants have to be filled with metal from the reactive electrode. The response time of the switching element can be reduced in this way. However, care must nevertheless be taken to ensure that the insulation property of the solid electrolyte is not impaired by the doping.

A method for fabricating a memory element according to the invention is preferably carried out in such a way that a first electrically conductive electrode material is applied to a substrate and is patterned for the purpose of forming the inert electrode. The substrate is provided with at least one active structure (transistor) which is electrically conductively connected to the inert electrode. A nanomask structure is subsequently formed on the inert electrode, which is preferably effected in a manner such that a solution containing nanoparticles (preferably diblock copolymers) is applied to the inert electrode, the nanomask structure forming in a self-assembled form during a subsequent drying process. The solid electrolyte is subsequently deposited on the nanoparticle structure, followed by the deposition of a second electrically conductive electrode material, which is patterned for the purpose of forming a reactive electrode. In this case, the material of the solid electrolyte and of the inert and reactive electrodes is chosen so as to meet the requirements set forth further above for forming a suitable redox system.

The memory element according to the invention may be arranged in a memory cell arrangement for fabricating a CBRAM memory.

FIG. 1 illustrates a schematic perspective view of a CBRAM memory cell with an "active in via" structure, where an exemplary construction of the memory cell can be discerned. An insulation layer 2 is deposited on a substrate 1 made, for example, of silicon, and a metallization 3 (level n) is formed on said insulation layer. The metallization 3 is in an electrically conductive contact with an active structure (transistor) in the substrate 1, this not being specifically illustrated in FIG. 1. A further insulation layer 4 is deposited on the metallization 3, and a hole (via) 8 is etched out in said insulation layer. First, a solid electrolyte 7 is deposited into the hole 8 and subsequently etched back, and a silver-rich (Ag-rich) material 6 is subsequently deposited and planarized. Instead of silver, it is possible to use any other suitable metal for forming a reactive electrode. A further metallization 5 (level n+1) is then deposited on the insulation layer 4 above the filled hole 8, said further metallization being in electrically conductive contact with the Ag-rich material 6. An inert electrode of the CBRAM memory cell is accordingly formed by the metallization 3 (level n), while a reactive electrode of the CBRAM memory cell is formed by the overlying metallization 5 (level n+1) in conjunction with the Ag-rich material 6 situated in the via 8.

Figure 2C:
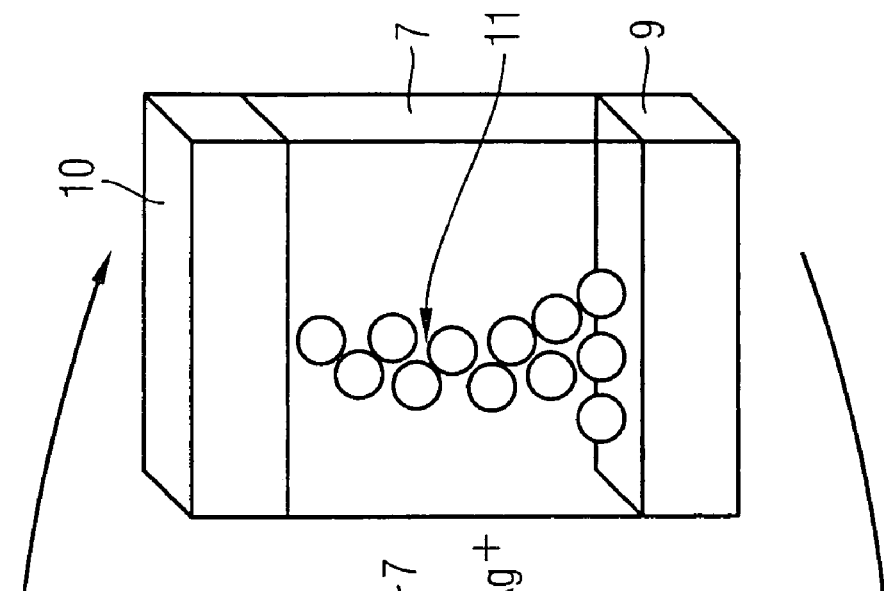
FIGS. 2A-2C schematically depict perspective views of a CBRAM memory element during the formation and resolution of the metallic current path.
Figure 2B:
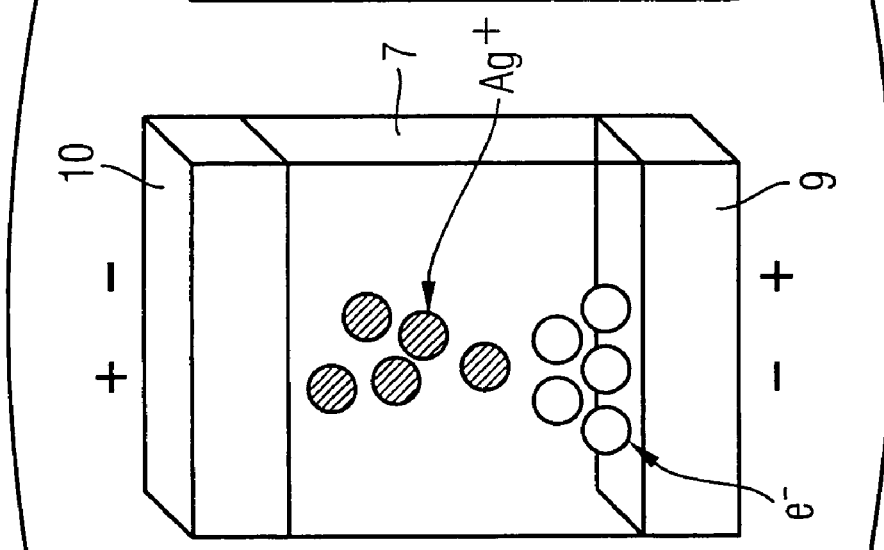
Figure 2A:
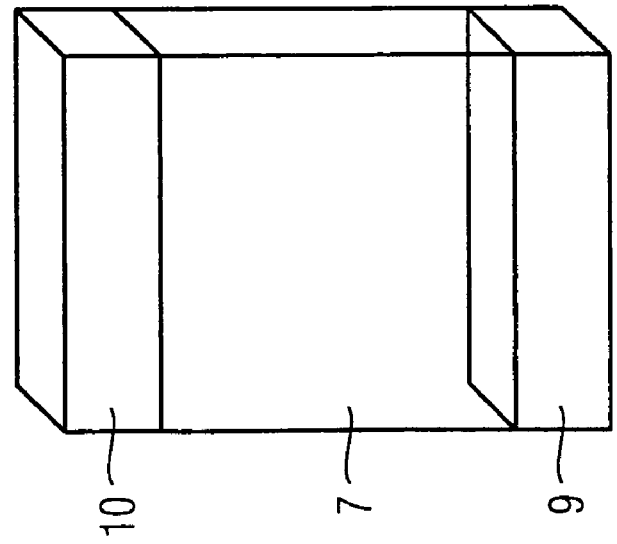

FIGS. 2A to 2C show in each case schematic perspective views of a CBRAM memory element, thereby illustrating the formation and resolution of the metallic current path between the inert electrode and the reactive electrode. The memory element includes an inert electrode 9 on the bottom side, a reactive electrode 10 on the top side, and a solid electrolyte 7 situated in between. FIG. 2A illustrates a situation in which no metallic bridge (current path) between the two electrodes is formed in the solid electrolyte 7. Accordingly, the memory element (or the memory cell) is in its high-resistance (OFF) state. If the positive pole (+) of a voltage source is then applied to the reactive electrode 10, metal ions are oxidized at the reactive electrode 10 and emitted into the solid electrolyte 7, where they are reduced and precipitate with formation of metal clusters in the drift direction of the metal ions, which is prescribed by the applied field between the two electrodes (FIG. 2B). $Ag^+$ ions are chosen as metal ions in the example shown, but this is not to be interpreted as being restrictive. In this case, metallic Ag is present at least proportionally in the reactive electrode 10, or the reactive electrode 10 is entirely an Ag electrode.

FIG. 2C shows a situation in which the metallic Ag precipitants have increased in number and size such that a metallic Ag bridge 11 forms between the inert electrode 9 and the reactive electrode 10. In this case, the memory element is in its low-resistance (ON) state.

In FIGS. 2A to 2C, the sequence by which the memory element is converted from the high-resistance state to the low-resistance state is symbolized by the arrow illustrated above the figures. The arrow illustrated below the figures symbolizes the sequence by which the memory element is converted from the low-resistance state to the high-resistance state by means of the metallic bridge 11 being resolved again by oxidation of the metallic Ag precipitants. This is achieved by connecting the reactive electrode 10 to the negative pole (−) of a voltage source. In order to switch the memory element between the ON and OFF states, it is necessary for the potential present at the reactive electrode 10 to exceed a specific threshold value resulting from the redox potential of the redox system reactive electrode/solid electrolyte.

Figure 3:
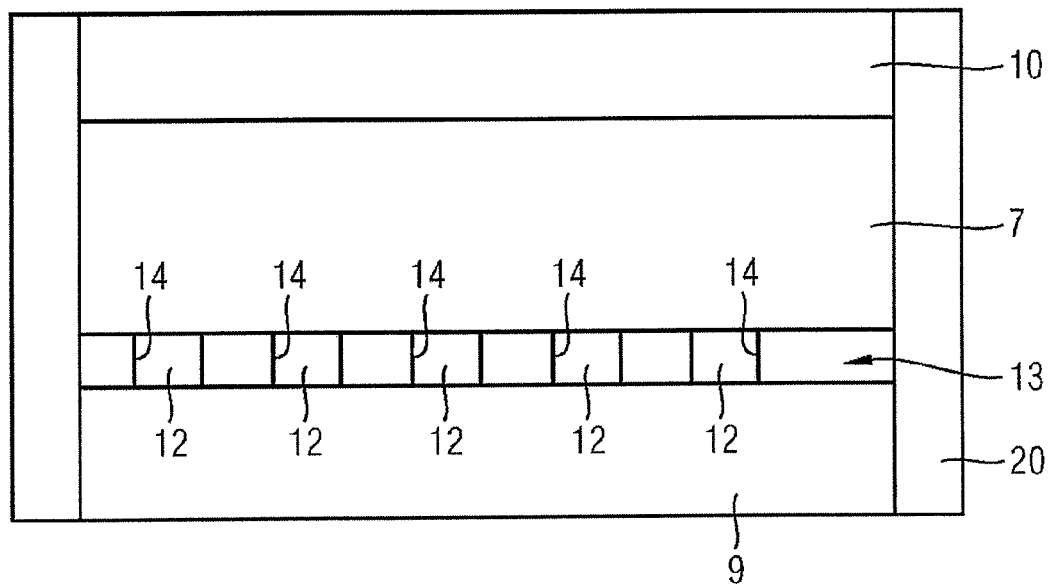
FIG. 3 schematically depicts a cross-sectional view through a CBRAM memory element in accordance with the present invention.

FIG. 3 shows a schematic cross section through a CBRAM memory element according to the invention. In particular, a nanomask structure 13 is deposited on an inert electrode 9, the solid electrolyte 7 is situated on the nanomask structure, and the reactive electrode 10 in turn is deposited on the solid electrolyte. The nanomask structure is provided with openings 14 through which the solid electrolyte 7 has contact with the inert electrode 9 in the form of "webs" 12. The stacked structure of inert electrode 9, nanomask structure 13, solid electrolyte 7 and reactive electrode 10 is embedded in an insulator 20 in this embodiment.

Figure 4:
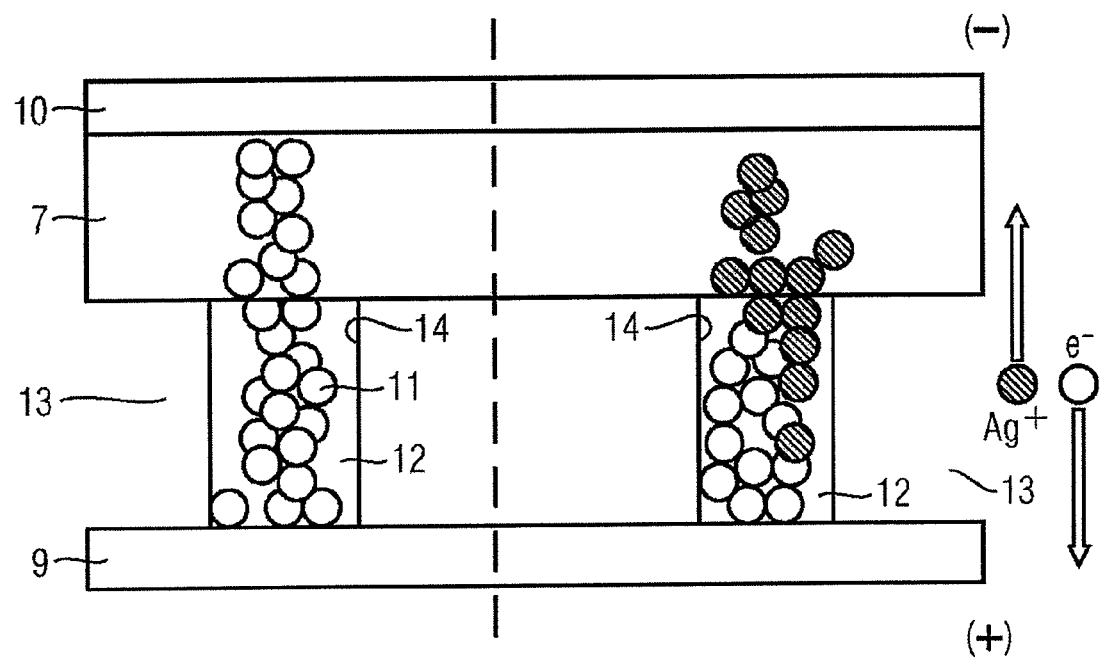
FIG. 4 schematically depicts a cross-sectional view through the CBRAM memory element of FIG. 3, with the nanomask structure being emphasized.

FIG. 4 shows a schematic cross section through the CBRAM memory element of FIG. 3, where the nanomask structure is emphasized. A programmed state of the memory element, in which a metallic bridge 11 is formed between inert electrode 9 and the reactive electrode 10, is illustrated in plan view on the left of the dashed vertical line. The lateral dimension of the metallic bridge 11 in a direction perpendicular to the drift direction, which is prescribed by the electric field between inert and reactive electrodes, of the metal ions is restricted or prescribed by the width of the opening 14 of the nanomask structure 13 determined in the same direction. The illustration shows in plan view on the right of the dashed vertical line a situation in which, by connecting the reactive electrode 10 to the negative (−) pole of a voltage source, the metallic bridge 11 is resolved by reoxidation of the metallic precipitates to form metal ions ($Ag^+$) and electrons ($e^-$). As already mentioned, the use of silver as metal for the reactive electrode is merely to be interpreted by way of example.

The construction of the memory cell or memory element according to the invention may be realized in vertical or horizontal embodiment on the (semiconductor) substrate, to be independent of the electrode materials chosen and the diffusion matrix (solid electrolyte), and also the nanomask structure. In one preferred embodiment, the inert electrode is to be chosen from a material having a high melting point such as, e.g., W, Mo, Ti, which forms an ohmic contact with, e.g., an Ag-doped chalcogenide alloy. Ag or Cu is advantageously used as material for the reactive electrode.

The sandwich like structure of the memory element may be fabricated by depositing a first layer made of electrically conductive material, for example Mo or W, by a conventional sputtering method or any other deposition method (such as vapor deposition, CVD methods, PLD, etc.). The material can be deposited into a previously etched hole and then planarized by chemical mechanical polishing (CMP). However, alternative patterning methods, such as deposition and subsequent etching of the electrode material, are also possible. Afterward, the bottom inert electrode produced in this way may be coated with a dielectric, through which a hole is subsequently etched, so that the solid electrolyte material thereupon deposited has a direct (electrical) contact to the inert electrode. In addition to the via structure, it is likewise possible to form the inert electrode in a so-called plug form by producing a plug-type bottom inert electrode by lithographic methods, over which an insulating layer (e.g. $SiO_2$ or SiN) is subsequently deposited. The insulating layer is removed above the bottom inert electrode, e.g., by CMP, so that it is possible to cover the inert electrode embedded in the insulating layer in upwardly open fashion with the nanomask structure.

The fabrication of an oxidic nanomask structure that can be used in the memory element according to the invention is described comprehensively in the references cited above using the example of ZnO. Starting substances for the synthesis are diblock copolymers, comprising polynorborene and polynorborene-dicarboxylic acid. These copolymers form the original for the nanoparticle structure (nanomask structure). After the synthesis of the copolymer, the latter after drying is brought into solution again, into which is then introduced a corresponding stoichiometric amount of $ZnCl_2$ that is likewise dissolved in tetrahydrofuran (THF). The $Zn^{2+}$ ions combine in the solution with the carboxyl groups of the second copolymer in the block.

If this solution is applied to a substrate, such as, for example, an inert electrode layer made of W, the layer grows in a hexagonally ordered manner in a self-assembled process. The solution may be applied by spinning, or the substrate (wafer) may be dipped into the solution. The metal salt may be converted into a metal oxide by $NH_4OH$ alkaline solution and the copolymer may be removed by plasma ashing. A nanomask structure formed from nanoparticles remains on the substrate (wafer) after this procedure. The particle size and the nanomask openings can typically vary in dimensions of between 3 nm and 15 nm (see K. Landfenster, *SFB* 569 (*TP G2*), *University of Ulm*, 2004). The further deposition of the solid electrolyte, for example a chalcogenide material, may be effected by a sputtering method or by a CVD or ALD method. After the application of, for example, an Ag doping layer by sputtering in an Ar atmosphere, a photodiffusion of the Ag doping layer into the solid electrolyte layer is achieved. The layer sequence fabricated in this way is then completed by deposition in a sputtering process of a second electrode material for the reactive electrode to form the memory element.

Figure 5A:
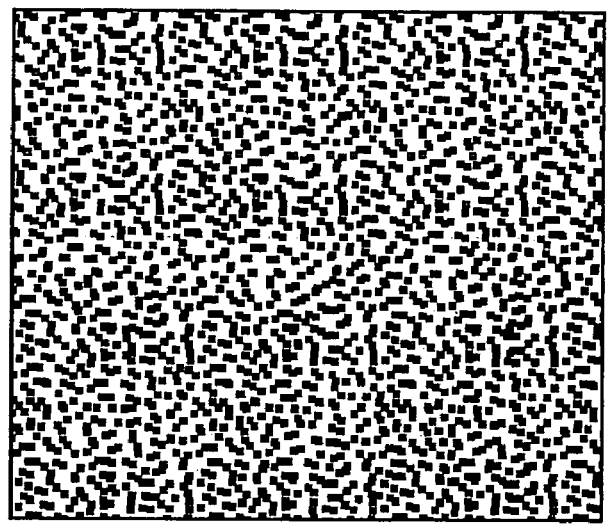
FIGS. 5A-5B are electron microscope micrographs of nanoparticle structures.
Figure 5B:
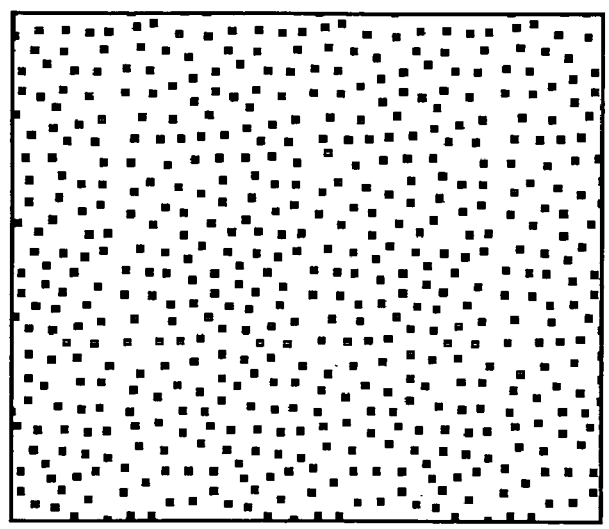

FIGS. 5A and 5B each show electron microscope micrographs of nanoparticle structures that were fabricated in the manner described above. In particular, FIG. 5A shows a nanoparticle structure in which the nanoparticles (bright locations) are at an average distance of 2.9 nm, so that the nanomask structure has an average size of the openings of 2.9 nm. A nanomask structure having an average size of the openings of 7.9 nm is correspondingly shown in FIG. 5B.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Substrate
2 Dielectric
3 Metallization
4 Dielectric
5 Metallization
6 Ag-rich layer
7 Solid electrolyte
8 Via
9 Inert electrode
10 Reactive electrode
11 Ag bridge
12 Solid electrolyte webs
13 Nanomask structure
14 Openings in nanomask structure

What is claimed is:

1. A resistive memory element for reversibly switching between a high-resistance OFF state and a low-resistance ON state, the resistive memory element comprising:
   a reactive electrode;
   an inert electrode;
   a solid electrolyte arranged between the reactive and inert electrodes; and
   a nanoparticle structure arranged on the inert electrode, wherein the nanoparticle structure is formed of a plurality of nanoparticles that are arranged at a distance and are separated from each other so as to define openings within the nanoparticle structure between the nanoparticles through which the solid electrolyte makes contact with the inert electrode, and the openings within the nanoparticle structure have a defined average size.

2. The resistive memory element of claim 1, wherein the average size of the openings in the nanoparticle structure is in the range of about 3 nm to about 15 nm.

3. The resistive memory element of claim 1, wherein an average size of the nanoparticles equals the average size of the openings in the nanoparticle structure.

4. The resistive memory element of claim 1, wherein the nanoparticle structure comprises an electrically insulating material.

5. The resistive memory element of claim 4, wherein the nanoparticles comprise an oxide.

6. The resistive memory element of claim 1, wherein the nanoparticle structure has a layer thickness in the range of about 2.5 nm to about 5 nm.

7. The resistive memory element of claim 1, wherein the solid electrolyte comprises at least one alloy including at least one chalcogen selected from the group consisting of Ag—S, Ag—Se, Ni—S, Cr—S, Co—S, Te—S, Te—Se, Ge—S, GeSe, Cu—S and Cu—Se.

8. The resistive memory element of claim 1, wherein the solid electrolyte comprises at least one porous metal oxide selected from the group consisting of Al—$O_x$, $WO_x$, and $TiO_x$.

9. The resistive memory element of claim 1, wherein the reactive electrode comprises at least one metal selected from the group consisting of Cu, Ag, Al, Au, Ni, Cr, V, Ti and Zn.

10. The resistive memory element of claim 1, wherein the inert electrode comprises at least one material from the group consisting of W, Mo, Ti, Ta, TiN, doped Si and Pt.

11. The resistive memory element of claim 1, wherein the solid electrolyte is doped with at least one metal.

12. The resistive memory element of claim 11, wherein the metal used for doping the solid electrolyte is the same metal that forms the reactive electrode.

13. A method for fabricating a resistive memory element comprising:
    applying a first inert electrode material to a substrate and patterning the inert electrode material to form an inert electrode;
    applying a solution containing nanoparticles to the inert electrode and drying the solution to form a self-assembled nanoparticle structure on the inert electrode, wherein the nanoparticle structure is formed of a plurality of nanoparticles that are arranged at a distance and are separated from each other so as to define openings within the nanoparticle structure between the nanoparticles;
    depositing a solid electrolyte on the nanoparticle structure and within the openings; and
    depositing a reactive electrode material on the solid electrolyte and patterning the reactive electrode material to form a reactive electrode.

14. A memory cell arrangement including at least one memory cell comprising the resistive memory element of claim 1.

15. The resistive memory element of claim 1, wherein the nanoparticles comprise zinc.

16. The method of claim 13, wherein the nanoparticles comprise zinc.

17. The method of claim 13, wherein the solution containing nanoparticles which is applied to the inert electrode comprises a copolymer and a metal.

18. The method of claim 17, wherein the metal comprises zinc.

19. The method of claim 17, wherein the copolymer is formed from polynorborene.

* * * * *